United States Patent [19]

Iwamoto et al.

[11] 4,417,262

[45] * Nov. 22, 1983

[54] GREEN LIGHT EMITTING DEVICE

[75] Inventors: Masami Iwamoto, Tokyo; Makoto Tashiro, Yokohama; Tatsuro Beppu, Tokyo; Akinobu Kasami, Yokohama, all of Japan

[73] Assignee: Tokyo Shibaura Denki Kabushiki Kaisha, Kawasaki, Japan

[ * ] Notice: The portion of the term of this patent subsequent to Sep. 23, 1997 has been disclaimed.

[21] Appl. No.: 250,934

[22] Filed: Apr. 6, 1981

Related U.S. Application Data

[63] Continuation-in-part of Ser. No. 169,612, Jul. 17, 1980, which is a continuation of Ser. No. 950,049, Oct. 10, 1978.

[30] Foreign Application Priority Data

Oct. 7, 1977 [JP] Japan .................................. 52-120037
Oct. 7, 1977 [JP] Japan .................................. 52-120039

[51] Int. Cl.$^3$ ............................................. H01L 33/00
[52] U.S. Cl. ........................................... 357/17; 357/90
[58] Field of Search ................................ 357/17, 30, 90

[56] References Cited

U.S. PATENT DOCUMENTS 4,101,920  7/1978  Nagasawa ............................. 357/17

Primary Examiner—Martin H. Edlow
Attorney, Agent, or Firm—Oblon, Fisher, Spivak, McClelland & Maier

[57] ABSTRACT

A green light emitting device, includes an n-type gallium phosphide (GaP) substrate, an n-type GaP layer and a p-type GaP layer laminated on the n-type GaP substrate. The net donor concentration in the n-type GaP layer decreases abruptly in steps from the GaP substrate side to the p-type GaP layer side. Nitrogen is contained in only the n-type GaP layer portion closest to the p-type GaP layer.

15 Claims, 14 Drawing Figures

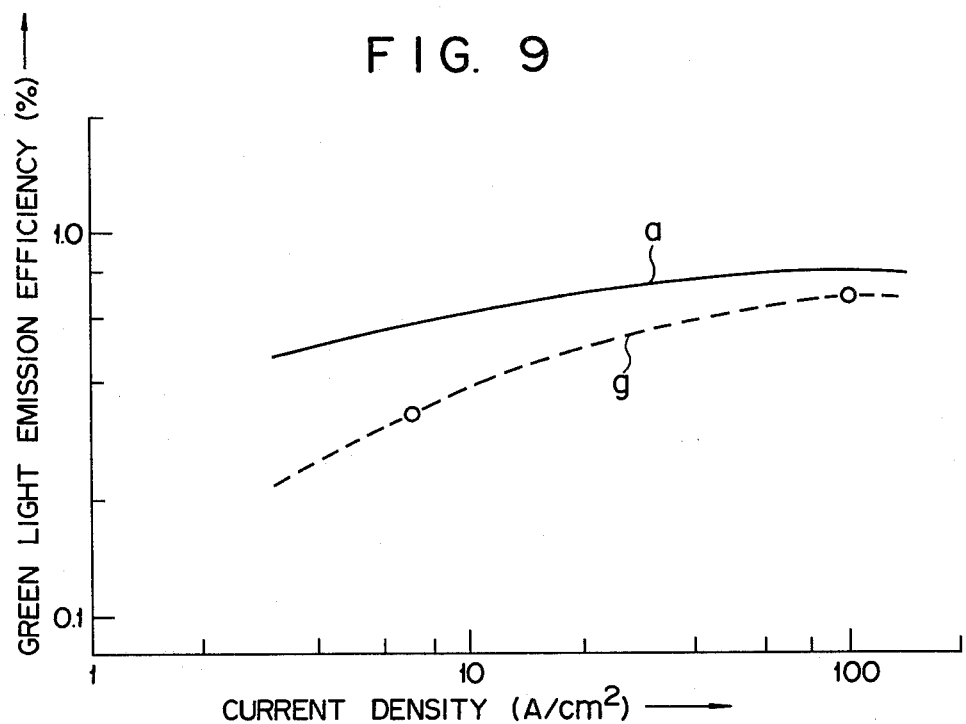
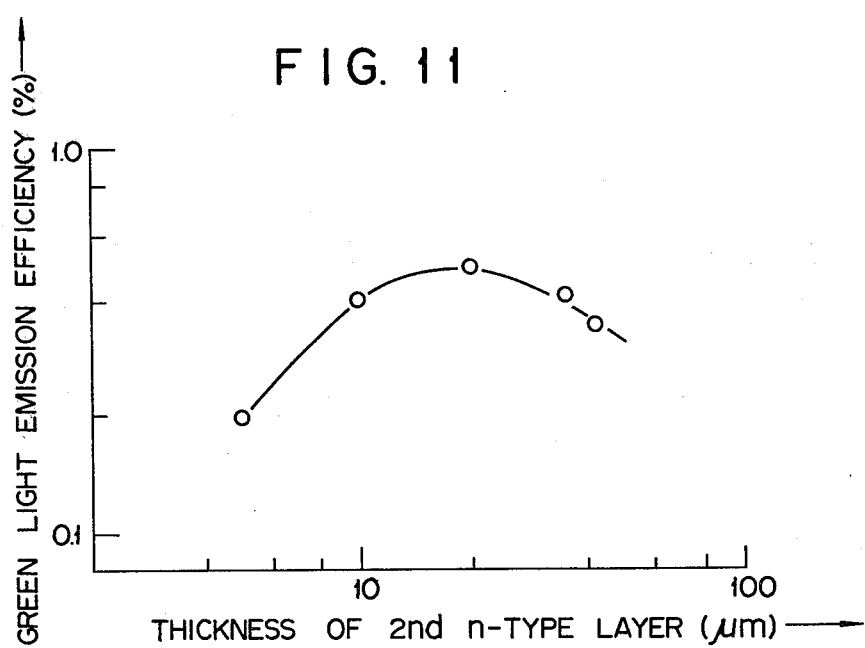

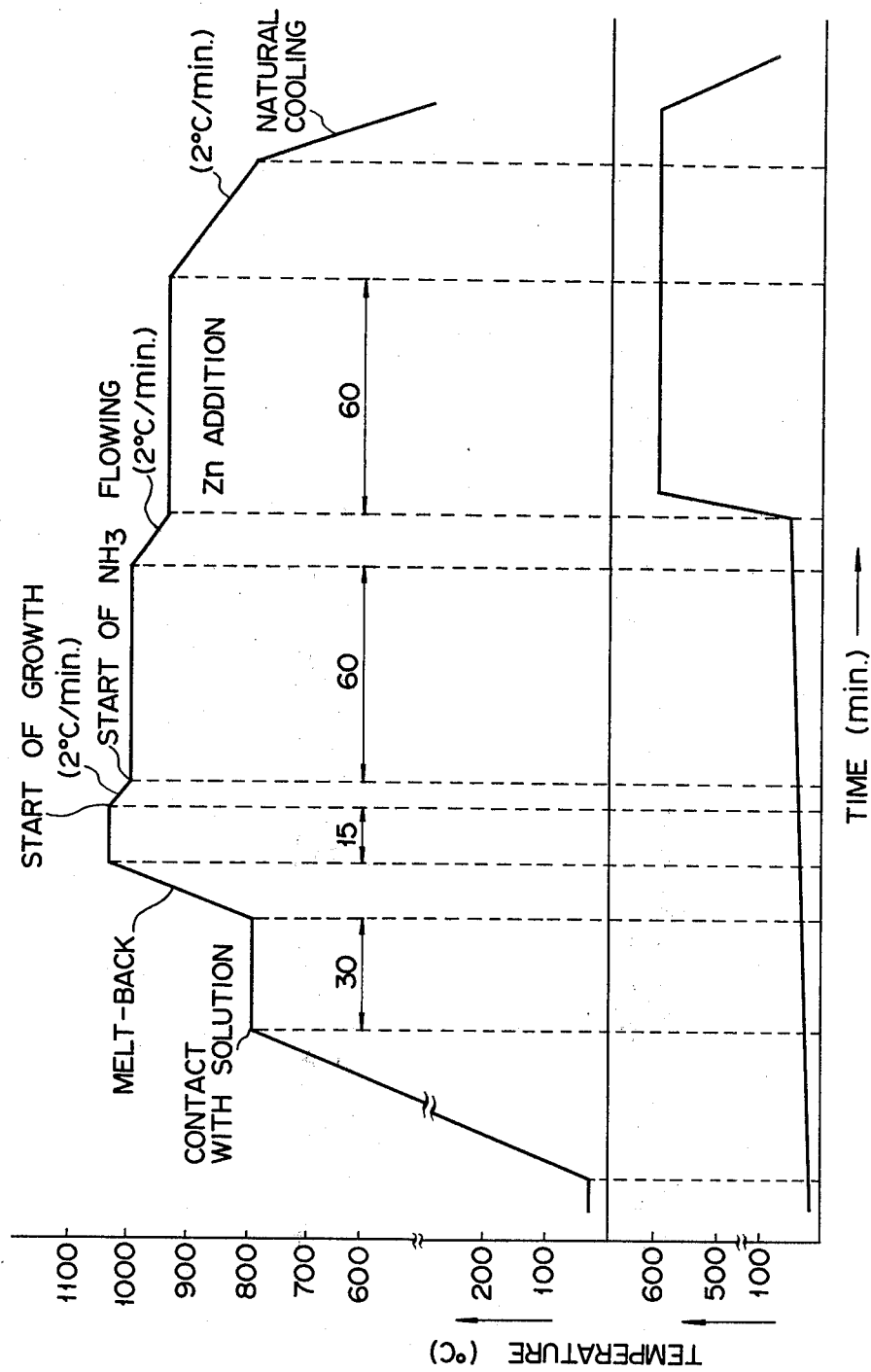

GREEN LIGHT EMITTING DEVICE

CROSS REFERENCE TO THE RELATED APPLICATION

This application is a continuation-in-part of application Ser. No. 169,612, filed on July 17, 1980 which is a continuation application Ser. No. 950,049, filed on Oct. 10, 1978.

BACKGROUND OF THE INVENTION

1. Field of the Invention

The invention relates to a III-V group compound semiconductor light-emitting diode and, more particularly, a GaP green light emitting diode.

2. Description of the Prior Art

GaP crystals or GaAsP (gallium arsenide phosphide) crystals of the III-V group compound semiconductors have been used as material for light emitting diodes which have also been widely used for various types of display devices. The light-emitting diode using the GaP crystal emits light with wavelengths ranging from 550 nm to 720 nm, i.e. green to red colors. The light emitting diode using GaAsP crystal emits light with wavelengths from 580 to 670 nm, i.e. yellow to red colors. In the green light emitting diode or the yellow light emitting diode, nitrogen doped atoms are used for the luminescence center impurity. Green light emitting GaP diodes in the light emission elements with nitrogen doping are prepared as follows. An n-type GaP layer is formed on an n-type GaP substrate by the liquid phase epitaxial growth method or the vapor epitaxial growth method. Then, a p-type GaP layer is further formed on the n-type GaP layer by the diffusion method or the liquid-phase epitaxial growth method. Nitrogen atoms serving as the luminescence center are added to the n-type GaP layer and the p-type GaP layer. For example, in a paper "IEEE Transactions on Electron Devices" Vol. ED-24 No. 7, on pages 951 to 955, published in July 1977, nitrogen atoms are added by using ammonia $NH_3$ or gallium nitride (GaN). The right column on page 954 in this article describes that there is a correlation between the nitrogen concentration ($N_T$) and the donor concentration ($N_D$) toward the growth direction in the n-type layer. From this description, it is estimated that, in order to improve the light emission efficiency ($N_\eta$), the donor concentration ($N_D$) should be decreased to increase nitrogen concentration in the vicinity of the p-n junction. As apparently seen from the diagram of FIG. 6 on page 953 in the article, when the $N_T$ is $1 \times 10^{18}/cm^3$ or more, the life time $\tau_G$ of minority carriers is shortened to be below 150 nsec and thus the light emission efficiency $\eta_G$ is reduced. Incidentally, in order to improve the light emission efficiency, it is necessary to improve the lifetime of minority carriers in the light emission region (the portion of the n-type GaP layer in the vicinity of the p-n junction) and to increase the luminescence center (nitrogen atoms) concentration in the light emission region. This is treated in "Aprll. Phys. Letters, Vol. 22 No. 5, on pp 227 to 229 (particularly equation (1) on page 229). This paper also describes that the lifetime of minority carriers is at maximum, 100 nsec when the donor concentration in the n-type GaP layer is approximately $1 \times 10^{17}/cm^3$, and the nitrogen concentration $N_T$ at this time is $1 \times 10^{19}/cm^3$. (However, a paper "J. Electron Mat." Vol. 1, pp 39 to 53, published in 1972 describes that the correct value of $N_T$ is approximately $\frac{1}{4}$ of the above $N_T$ value). This paper, however, does not refer to a means to improve the lifetime of minority carriers and to improve the $N_T$ in the portion of the n-type GaP layer in the vicinity of the p-n junction, although FIG. 2 on page 228 denotes that the lifetime of the minority carries in the n-type GaP may be improved by decreasing the $N_D$. In this case, however, it is saturated when the $N_D$ is below $1 \times 10^{17}/cm^{-3}$.

In a paper "J. Electrochem. Soc." Vol. 122, No. 3, pages 407 to 412, published in 1975, it is described that, when the temperature in the epitaxial growth of the n-type GaP layer is low and the temperature for p-n junction formation is decreased to 850° C., the lifetime of the minority carrier is improved to be 200 nsec. In this case, the $N_T$ is $2 \times 10^{18}/cm^3$, $N_D$ $7.6 \times 10^{16}/cm^3$ (or, $6 \times 10^{16}/cm^3$ or $1.7 \times 10^{16}/cm^3$). Accordingly, various conditions mentioned above may be satisfied to some extent. The light emission efficiency of the diodes prepared by this method is 0.35% at maximum under the forward current of 25 A/cm$^2$ and with the epoxy moulding of the device (FIG. 2).

In a paper "J, Electrochem. Soc." Vol. 119, No. 12, pages 1780 to 1782, particularly FIG. 2 on page 1782, published in Dec., 1972, an experiment and calculation are performed to find what number of nitrogen atoms enter the GaP growth layer with respect to growth temperature, when the liquid phase growth method is employed as in the previous paper. FIG. 2 of this paper shows that, when the growth temperature of GaP is at 960° C., the $N_T$ is approximately $2 \times 10^{18}/cm^3$ at maximum and it becomes larger as the temperature becomes higher.

From the facts mentioned above, it is inferred that, in order to improve the light emission efficiency, it is preferable that the $N_D$ of the n-type GaP layer is set low, for example, $6 \times 10^{16}/cm^3$, the $N_T$ approximately $2 \times 10^{18}/cm^3$ and the lifetime of the minority carrier is set at 200 nsec. On the inference, when considering a description that the light emission efficiency is 0.33% (the device is moulded) at a current of 7 A/cm$^2$ in a paper "Journal of Crystal Growth 27", pp 183 to 192, particularly on page 191, the device described is estimated that $N_D$ of the n-type GaP layer is low, $N_T$ is large and the lifetime of minority carriers is long. As seen from FIG. 6 on page 189 in the paper, when an n-type GaP layer is formed on the n-type GaP substrate by the liquid phase epitaxial growth method, H$_2$S and ammonia NH$_3$ are added in gas phase into a Ga solution. In mid course, growth and the addition of H$_2$S are stopped, and it is subjected to purging at about 970° C. to remove sulfur S from the Ga solution. Zinc (Zn) and ammonia (NH$_3$) are added into the solution of Ga, and then growth of the p-type GaP layer is started in liquid phase epitaxial process. As a consequence, it is considered that the lifetime of the minority carriers is long and the light emission efficiency improved.

FIG. 7 on page 189 of the same article illustrates only a baking condition in which donor impurity concentrations change in accordance with the change of the thickness of the growth layer, the $N_D$ of the top portion thereof decreasing by the disappearance of sulfur (S) in the purging at 970° C.

The GaP green light emitting element thus manufactured exhibits the maximum efficiency of light emission under the manufacturing condition described in the above-mentioned document. That is, the average light emission efficiency is approximately 0.15% (with being molded) under 25 A/cm².

SUMMARY OF THE INVENTION

Accordingly, an object of the present invention is to provide a green light emitting diode with the average light emission efficiency of 0.4% or more under a condition that the device is epoxy-moulded and 25 A/cm² of current is fed to the diode. This value of light emission efficiency holds true for groups of diodes, where each group consists of several diodes made from a wafer, which have relatively high light emission efficiencies. The average light emission efficiency of all the diode elements made of wafers, including those having relatively poor efficiencies, is about 0.3%.

According to the invention, there is provided a green light emitting diode including an n-type GaP substrate, an n-type GaP layer formed thereon and a p-type GaP layer formed thereon, wherein the net donor concentration in the n-type GaP layer abruptly decreases in steps from the GaP substrate side to the p-type GaP layer and nitrogen is contained in the portion of the n-type GaP layer closer to the p-type GaP layer.

Other objects and features of the invention will be apparent from the following description taken in connection with the accompanying drawings, in which:

BRIEF DESCRIPTION OF THE DRAWING

FIG. 9 is a graph illustrating a variation of the green ligh emission efficiency with respect to current density;

FIG. 11 is a graph illustrating a relation of the green light emission efficiency versus the thickness of the 2nd n-type layer;

FIG. 14 diagrammatically shows a temperature profile in another manufacturing method of the device according to the invention.

DESCRIPTION OF THE PREFERRED EMBODIMENTS

Figure 1:
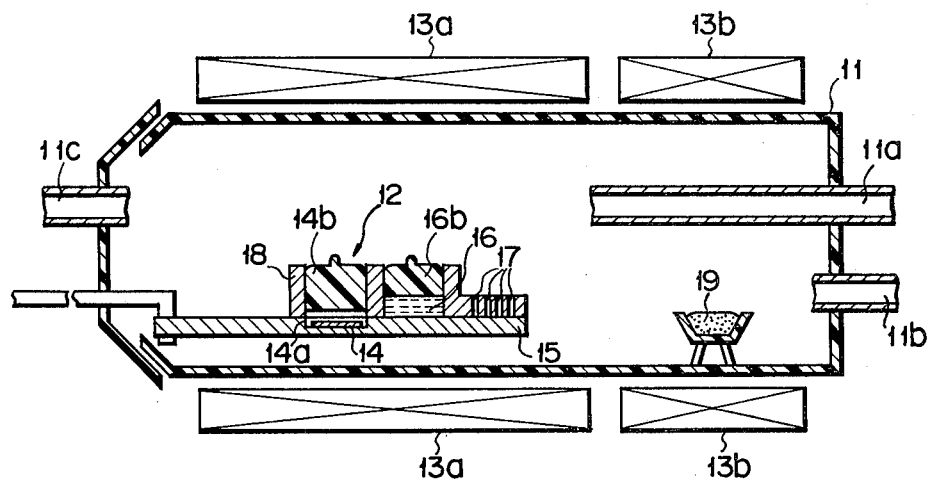
FIG. 1 is a longitudinal sectional view showing a liquid phase epitaxial growth apparatus which is used for manufacturing light emitting diodes according to the invention.
Figure 4:
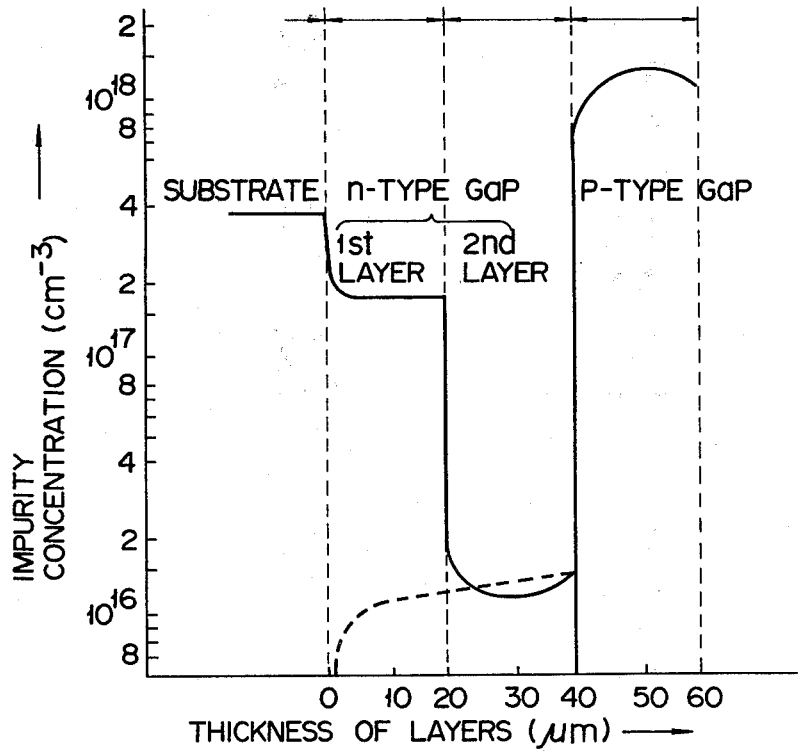
FIG. 4 is a graph of the relation of the impurity concentration to the thickness of an n-type GaP layer formed on an n-type GaP substrate by the apparatus in FIG. 1.

By using a liquid phase epitaxial growth apparatus shown in FIG. 1, an n-type GaP epitaxial layer is grown or deposited on an n-type GaP substrate. The donor concentration $N_D$ of the n-type GaP layer grown has a distribution which changes abruptly in steps, as shown in FIG. 4. A p-type GaP layer is further grown on the n-type layer. Thus constructed light emitting diodes have a light emission efficiency superior to that of the conventional comparable ones. This results from the fact that the luminescence center concentration $N_T$ of the n-type GaP layer is high, approximately $2 \times 10^{18}/cm^3$, for example, and the life-time of minority carriers is very long, for example, 330 nsec or more on an average.

Figure 2:
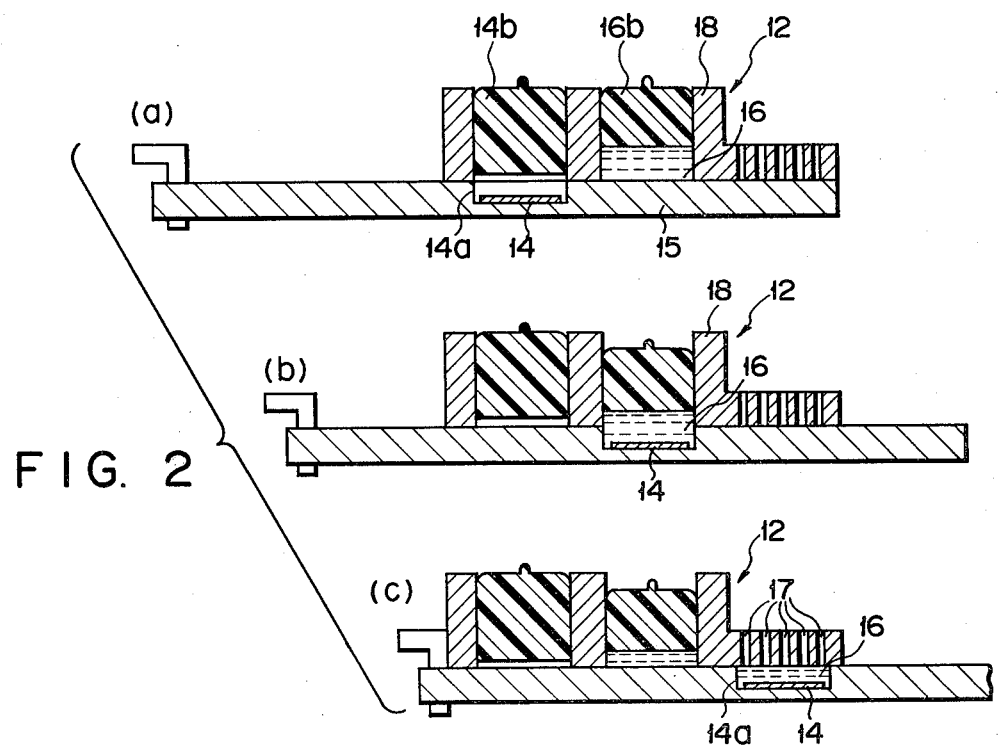
FIG. 2 is a view showing a liquid-phase epitaxial growth boat used in the apparatus in FIG. 1, illustrating how the growth boat is driven.
Figure 3:
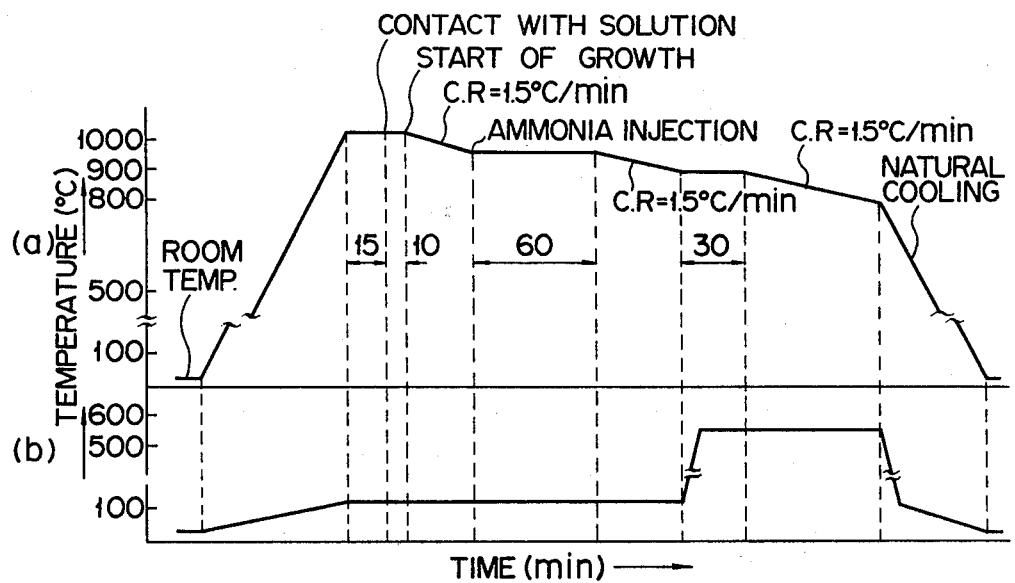
FIG. 3 is a graph illustrating temperature profiles (a), (b) of the growth boat and an impurity evaporation source in the system of FIG. 1.

In the liquid phase epitaxial growth apparatus shown in FIG. 1, a deposition or growth boat 12 is placed in a reaction chamber 11 of quartz and a couple of heating coils 13a and 13b are wound around the reaction chamber 11. The growth boat 12 is comprised of a slider 15 having a depression 14a for holding an n-type GaP substrate or wafer 14, and a solution containing boat 18 with a hollowed portion for containing a solution 16 and a plurality of perforations 17 for doping the impurity. Covers 14b and 16b each made of quartz, for example, are fitted in the depression and the hollowed portion, as shown. An impurity evaporation source 19 of zinc (Zn) is disposed on the right side in the reaction chamber 11, apart from the growth boat 12. The reaction chamber 11 is provided at both ends with gas supply pipes 11a and 11b and a gas exhausting pipe 11c. For growing or depositing an n-type Gap layer and a p-type GaP layer on the n-type GaP wafer by using the epitaxial growth apparatus in FIG. 1, the boat 12 is moved as shown in FIG. 2. To start the epitaxial growth, the n-type sulfur doped GaP wafer 14 is placed in the depression of the slider 15 of graphite, for example. The dislocation density (EPD) of the wafer at this time is less than $1 \times 10^5/cm^2$, preferably 5 to $8 \times 10^4/cm^2$. Then, Ga metal of 5 g is set into the solution containing pot of the boat 18, and $H_2$ gas is introduced through the gas supply pipe 11b into the reaction chamber 11. The heating coil is energized to heat the boat 12 to 1010° C., thereby to form the Ga solution 16 not including donor impurity (but including residualty doped donor impurities, for example, silicon and the like) and unsaturated with GaP. Fifteen minutes after the temperature reaches 1010° C., the slider 15 is moved to cause the solution 16 to come in contact with the surface of the GaP wafer 14, as shown in FIG. 2b. The slider 15 is further advanced carrying a part of the solution 16 over the surface of the wafer 14 until the depression of the slider 1 comes under the perforations 17, as shown in FIG. 2c. The depth of the depression is previously set so as to receive the solution 16 of a depth of 1.5 mm, for example. This state of the slider is left for about 10 minutes to permit the surface of the GaP wafer 14 to melt into the solution 16. Then, the solution is cooled at a given cooling rate of 1.5° C./min., for example, to a given temperature, for example, 960° C. Through this cooling step, an n-type GaP layer (first layer) not including nitrogen as will be referred to later relating to FIG. 4, grows to be approximately 20 μm on the n-type GaP wafer or substrate 14. The $N_D$ of the n-type GaP layer is slightly smaller than that of the n-type GaP substrate 14. The first layer has the donor concentration $N_D$ of about $1.8 \times 10^{17}/cm^3$, as shown in FIG. 4. As will be described later, the $N_D$ of the first layer may conversely be higher than that of the substrate, for example. The reason for this is that the surface of the quartz reaction tube constituting the growth chamber 11 is reduced by hydrogen gas and therefore a great amount of silicon (Si) is doped into the solution. The temperature of the solution is kept at 960° C. for a predetermined period of time, for example 60 minutes. During this period, argon gas (Ar) and ammonia ($NH_3$) are continuously introduced through the gas supply pipe 11a into the reaction chamber 11. As a result, the ammonia passes through the perforations 17 and reacts upon the gallium solution 16 over the GaP substrate which has been partly grown under the condition as shown in FIG. 2c, with the result that nitrogen atoms are added thereinto until the saturation thereof and reacts upon silicon (Si) droped from the reaction chamber, for example, into a part of the solution 16, thereby to form ($Si_3N_4$). The sulfur (S) in the solution 16 is partly evaporated during the constant temperature time interval. After 60 minutes, the solution is again cooled at the cooling rate of 1.5° C./min., for example, to 900° C. Through this cooling step, a new n-type GaP layer (second layer) is grown over the n-type GaP layer (first layer) partly grown. The n-type layer grown up to this time is totally 40 μm in thickness. The second layer grown contains much of nitrogen and has a considerably smaller $N_D$, for example, $1.3 \times 10^{16}/cm^3$, as shown in FIG. 4. The solution is left as it is at 900° C. for given time. At the start of this step, the heater 13b for the impurity evaporation source Zinc 19 is operated to heat the source up to 560° C. and is kept at this temperature. During this constant temperature step, the zinc (Zn) with high vapor pressure evaporates, together with Ar gas fed from the gas supply pipe 11b shown in FIG. 1, penetrates into the solution 16 over the substrate 14 on which the first n-type layer has been grown, through the perforations 17. Then, the solution 16 is cooled again at a given cooling rate of 1.5° C./min. to 800° C. As a result, a new p-type GaP layer doped with nitrogen of about $2 \times 10^{18}/cm^3$ has grown over the substrate with the first and second n-type layers previously formed thereon. After this, the heaters 13a, 13b are turned off and the solution is subjected to natural cooling. The temperature programs for the growth boat 12 and for the impurity evaporation source 19, which have been described above, are shown by sections (a), (b) in FIG. 3.

The donor concentration $N_D$ of the n-type GaP layer formed on the substrate has an abrupt step-like distribution descending in the growth direction as indicated by solid line in FIG. 4. The reason for this is considered in the following. Although roughly mentioned in the embodiment, in the growth of the first layer formed directly on the substrate in the total n-type GaP layer, the surface of the GaP substrate is once melted by the solution of unsaturated GaP not including donor impurities. For this $N_D$ is $1.8 \times 10^{17}/cm^3$ as seen from FIG. 4 i.e. in the order of $10^{17}/cm^3$. In the growth of the 1st layer, the surface of the quartz reaction tube is reduced by hydrogen gas so that much silicon (Si) is doped into the solution. Therefore, the major donor impurity in the first layer is silicon Si ($N_D$ is the above-mentioned value). The 2nd layer formed closer to the p-type GaP layer in the total n-type GaP layer is grown or deposited in an Ar gas atmosphere including ammonia. A great amount of nitrogen is accordingly added into the gallium solution so that a part of nitrogen and silicon (Si) in the solution cooperate to form a stable compound. As result, the active silicon amount in the solution is reduced thereby to decrease $N_D$ of the second layer. Therefore, the donor concentration of the second layer depends largely on the donor impurity (S in this example) melted from the substrate. It is considered therefore that $N_D$ of the second layer is be about one order of magnitude lower than that of the first layer, as indicated by the solid line in FIG. 4. If nitrogen is added from the growth stage of the first layer, the donor impurity changes as indicated by dotted lines in FIG. 4.

Figure 5:
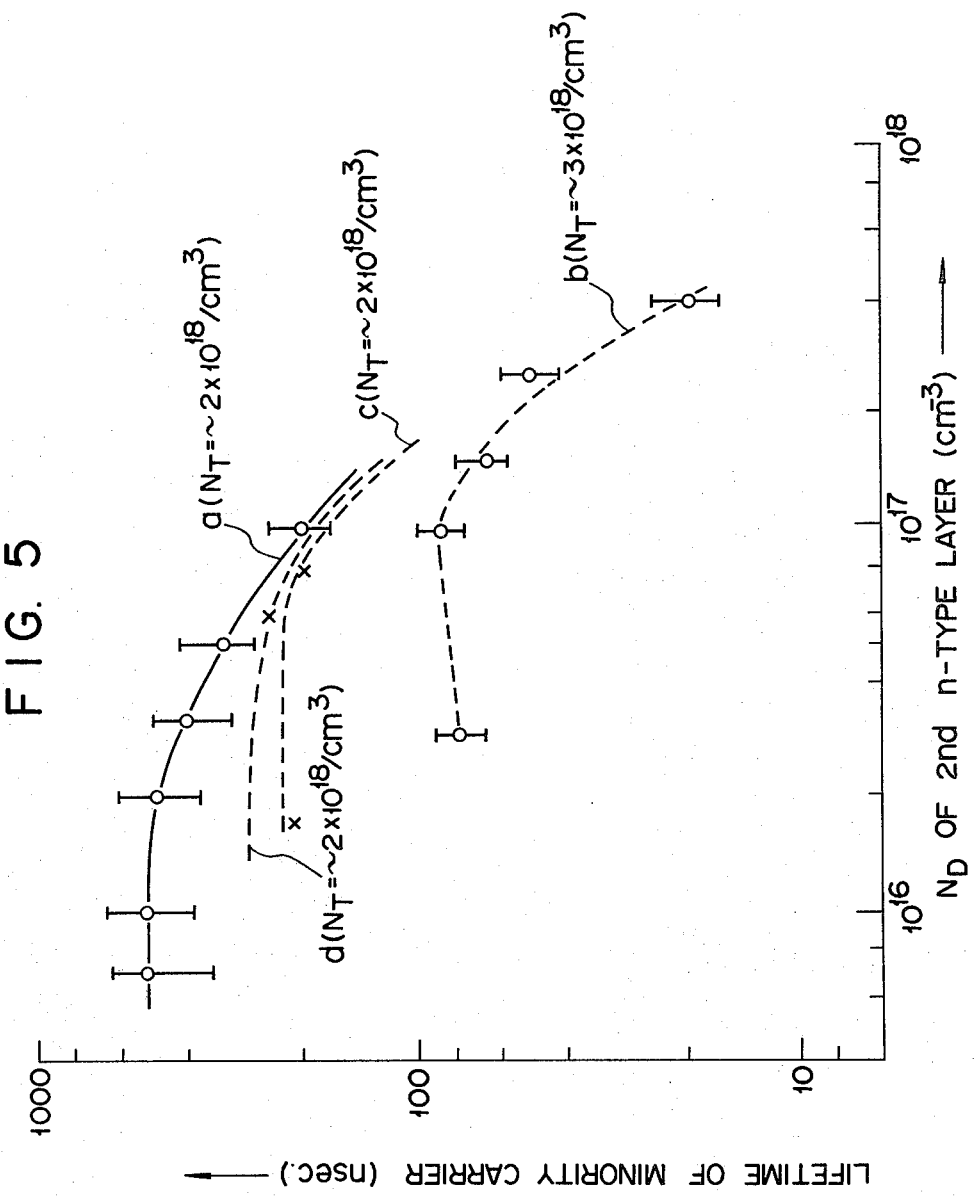
FIG. 5 is a graph illustrating a curve of the lifetime variation of minority carriers in the n-type GaP layer part (2nd layer) closer to a p-type GaP layer with respect to the donor concentration $N_D$ in the same layer of n-type and a curve of the lifetime of an n-type GaP layer with respective to the $N_D$ for the previous devices.

When $N_D$ of the first layer and $N_D$ of the second layer change in abrupt steps decreasing in the growth direction as mentioned above, the step-like distribution pattern of the donor concentration from the first layer to the second layer eliminates the lattice defect originating from the substrate and improves the crystal quality in the second layer, that is to say, even when much nitrogen is added, the life-time of minority carriers in the second layer may be elongated, as will subsequently be described referring to FIG. 5.

As seen from the above description, the relation of $N_T$ between the first and second layers is inversely related to the relation of $N_D$ therebetween, as seen from the embodiment mentioned above. This results from the fact that, in the growth of the n-type layer, ammonia is added in the mid course of the growing. The ammonia is added into the solution and further the solution with ammonia added is placed in the Ar atmosphere for 60 minutes. Accordingly, even if a part of ammonia, together with silicon (Si) in the solution, forms a compound, the amount of ammonia is little affected by the compound forming so that nitrogen atoms may enter into the second layer up to the solid solution limit concentration at 960° C. Therefore, a great amount of nitrogen is doped into the region in the vicinity of the p-n junction so that the light emission efficiency is improved.

The effect of the embodiment mentioned above will be described with reference to FIGS. 5 to 13. As described in the Prior Art, the best way to improve the light emission efficiency of the GaP green light emitting device is to decrease the donor concentration of the n-type GaP layer while increasing the nitrogen concentration $N_T$ thereof and to improve the lifetime of the minority carriers. With this fact in mind, measurement was made of the lifetime of minority carriers against the donor concentration $N_D$ of the second layer which most contributes to the light emission, when the double n-type GaP layer on the substrate is formed as in the above embodiment of the invention. The measurement result is traced as indicated by a curve a in FIG. 5. As seen from the curve a, when the donor concentration $N_D$ of the second layer is less than $5 \times 10^{16}/cm^3$, the lifetime of minority carriers is 330 nsec or more. This value is remarkably large compared to 100 nsec at maximum (curve b in FIG. 5) described in the article "Appl.

Phys. Lett" Vol. 22, No. 5, on page 228 (referred simply to as an article A), published on March 1973, and approximately 220 nsec (curve c in FIG. 5, the actual measured value is designated by symbol x) described in the article "J. Electrochem. Soc.," Vol. 122, No. 3, on page 410 (referred simply to as an article B), published in 1975. An example where an n-type GaP layer is epitaxially grown on an n-type GaP substrate is described in an article of "Journal of Electric Material" Vol. 2, No. 1 on pages 137 to 159 (referred simply to as an article C), published in 1973. This article also described that, when nitrogen is included, the lifetime of minority carriers is short, 100 to 150 nsec.

The reason why the lifetime of minority carriers in the second layer of the invention is long, may be considered as below. The discontinuity of the crystal due to stress arising from the rapid change of the concentrations in the first and second n-type layers, interrupts or absorbs non-radiative centers (including various dislocations due to the imperfection of crystal or point defects of residual impurity or the like) introduced from the substrate into the n-type GaP layer so that a reduced number of non-radiative centers are transferred to the second n-type layer. For comparison, measurement was made of the lifetime of minority carriers in the vicinity of the p-n junction when the distribution of donor concentration $N_D$ in the n-type GaP layer is monotonously decreased in the growth direction. As seen from a curve d in FIG. 5 tracing the result of the measurement, it is considerably shorter than that of the invention. This may be estimated that, since no rapid change of the donor concentration $N_D$ takes place in the n-type GaP layer, the non-radiative centers propagated from the substrate continues its propagation near the p-n junction. In this experiment the nitrogen concentration was fixed to be about $2 \times 10^{18}/cm^3$.

On the basis of the measurement result shown in FIG. 5, an examination was conducted of the relation of the product of the nitrogen concentration ($N_T$) and the lifetime of the minority carriers against the donor concentration $N_D$ of the second layer. The prior art describes that the product of $N_T$ and the lifetime of minority carriers is directly related to the light emission efficiency. The result of the examination is indicated by a curve a in FIG. 6, when the donor concentration $N_D$ in the second layer is $5 \times 10^{16}/cm^3$ the product of $N_T$ and the lifetime of minority carriers is 60 or more and this is remarkably higher than that shown in the article A (indicated by a curve b in FIG. 6), the article B (curve c) or when the donor concentration ($N_D$) of the n-type GaP layer is decreased monotonously in the growth direction (curve d). The reason for this is that $N_T$ of the second layer may be controlled precisely and widely, in addition to the reason described relating to FIG. 5. When the second layers are respectively formed having different nitrogen concentrations ($N_T=5 \times 10^{17}/cm^3$, $1 \times 10^{18}/cm^3$ and $2 \times 10^{18}/cm^3$) the wavelengths of lights emitted vary as illustrated in FIG. 7, incidentally.

Figure 6:
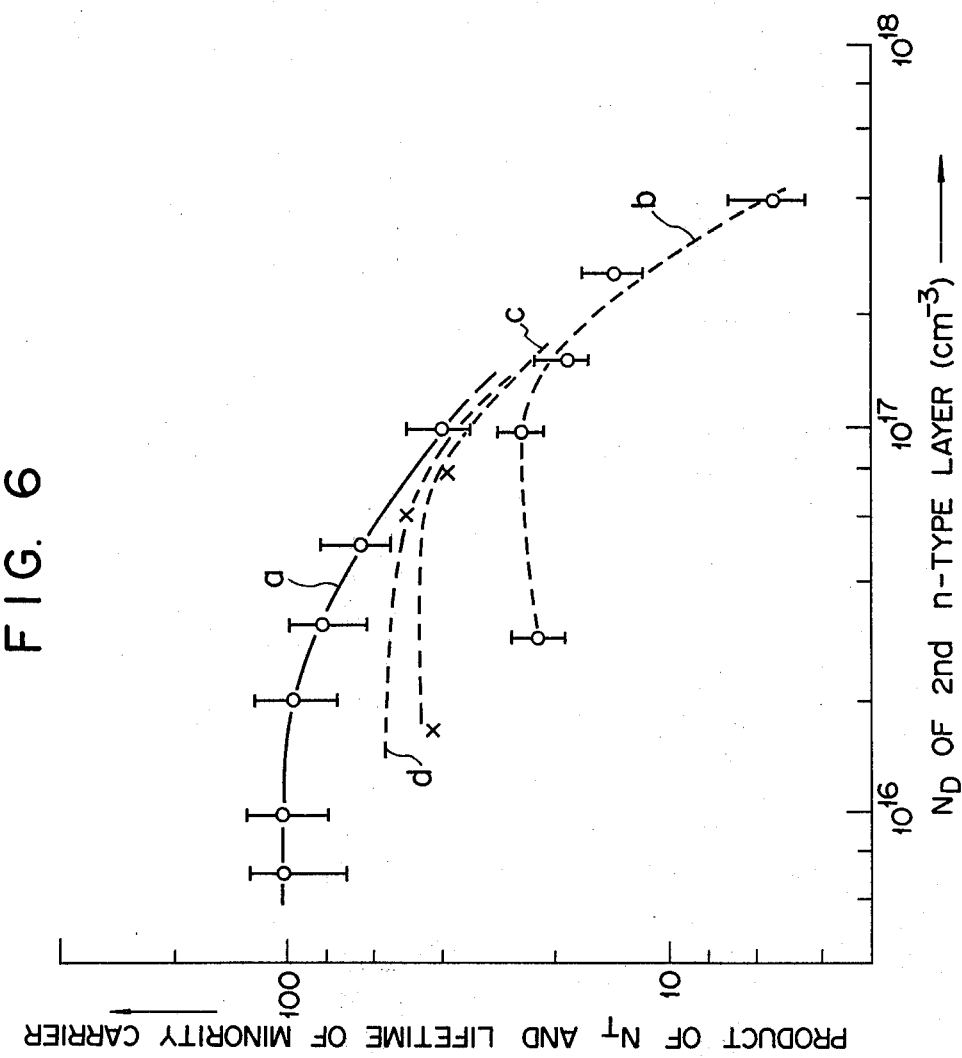
FIG. 6 is a graph illustrating the relation between the product of $N_T$ and lifetime of minority carriers with respect to $N_D$ of the n-type GaP layer part (second layer) closer to the p-type layer.
Figure 7:
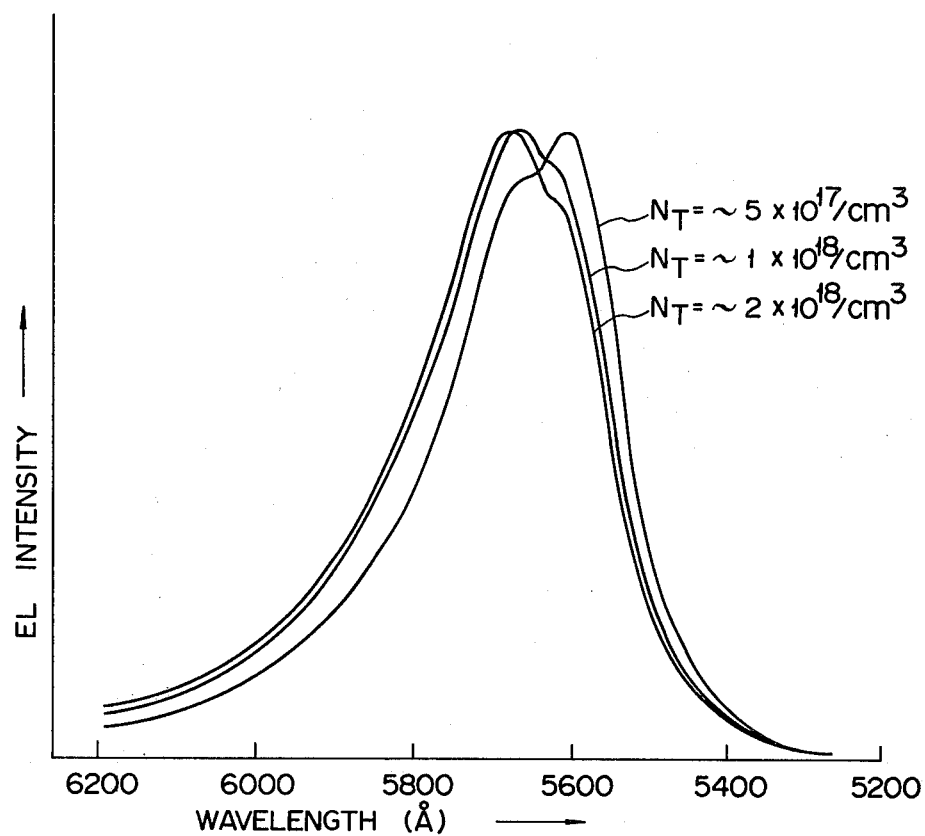
FIG. 7 is a graph illustrating the relation between EL intensity and the wave length of emitted light when the nitrogen concentration of the second layer changes.

On the basis of the results shown in FIGS. 5 and 6, the light emission efficiency dependence on the $N_D$ of the second layer was measured. The result of it is illustrated by a curve e in FIG. 8. The measurement was conducted under the condition that the current density was 25 A/cm², $N_T$ approximately $2 \times 10^{18}/cm^3$, $N_D$ in the first layer 1 to $5 \times 10^{17}/cm^3$ and the device is molded with epoxy resin. The change of the lifetime of minority carriers in FIG. 5 with respect to the donor concentration $N_D$ also is shown by a curve f for the purpose of reference. As seen from FIG. 8, when the $N_D$ of the second layer is 1 to $5 \times 10^{16}/cm^3$, green light emission efficiency is 0.4% or more in average and, when $N_D$ is $2 \times 10^{16}/cm^3$, for example, the efficiency is approximately 0.7% at maximum, that is to say, very high. This value has never been attained in the world, as far as we know. The highest light emission efficiency is found in an article of "Journal of Crystal Growth 27" (referred to as an article D) on page 191, published in 1974. In the example of the article D, a part of green light emitting diodes exhibit the light emission efficiency of 0.7% with 100 A/cm² of current density. In the case of the present invention, the efficiency is 0.8% or more under the same condition. This fact is comparatively illustrated in FIG. 9, in which a curve a indicates an efficiency curve of the invention and a curve g is the one of the article D. The reason for this is considered that the $N_D$ distribution of the n-type GaP layer takes a stepwise pattern, the lifetime of the minority carriers in the second layer is longer and the second layer alone contains nitrogen of a high concentration.

Figure 8:
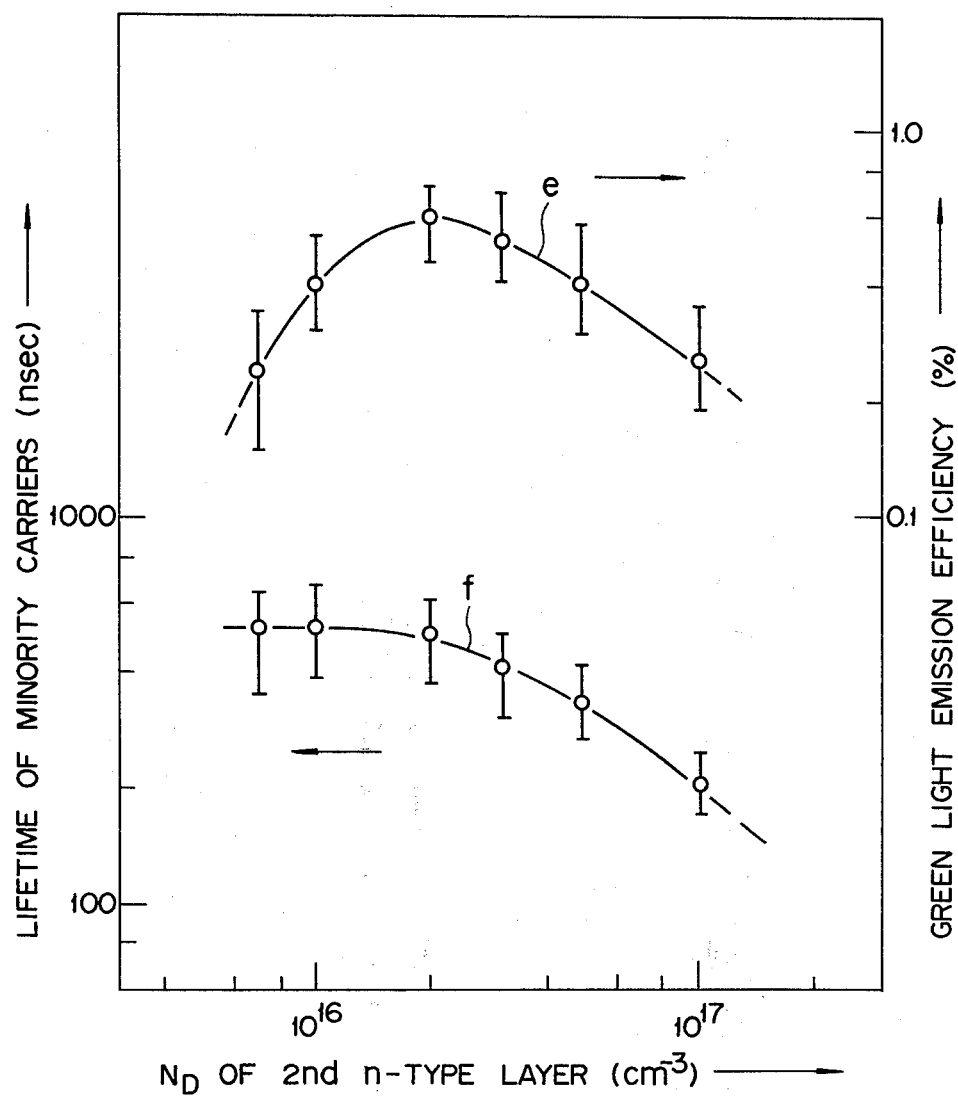
FIG. 8 is a graph illustrating the dependences of the lifetime of minority carriers and the green light emission efficiency on the $N_D$ of the 2nd n-type layer.
Figure 10:
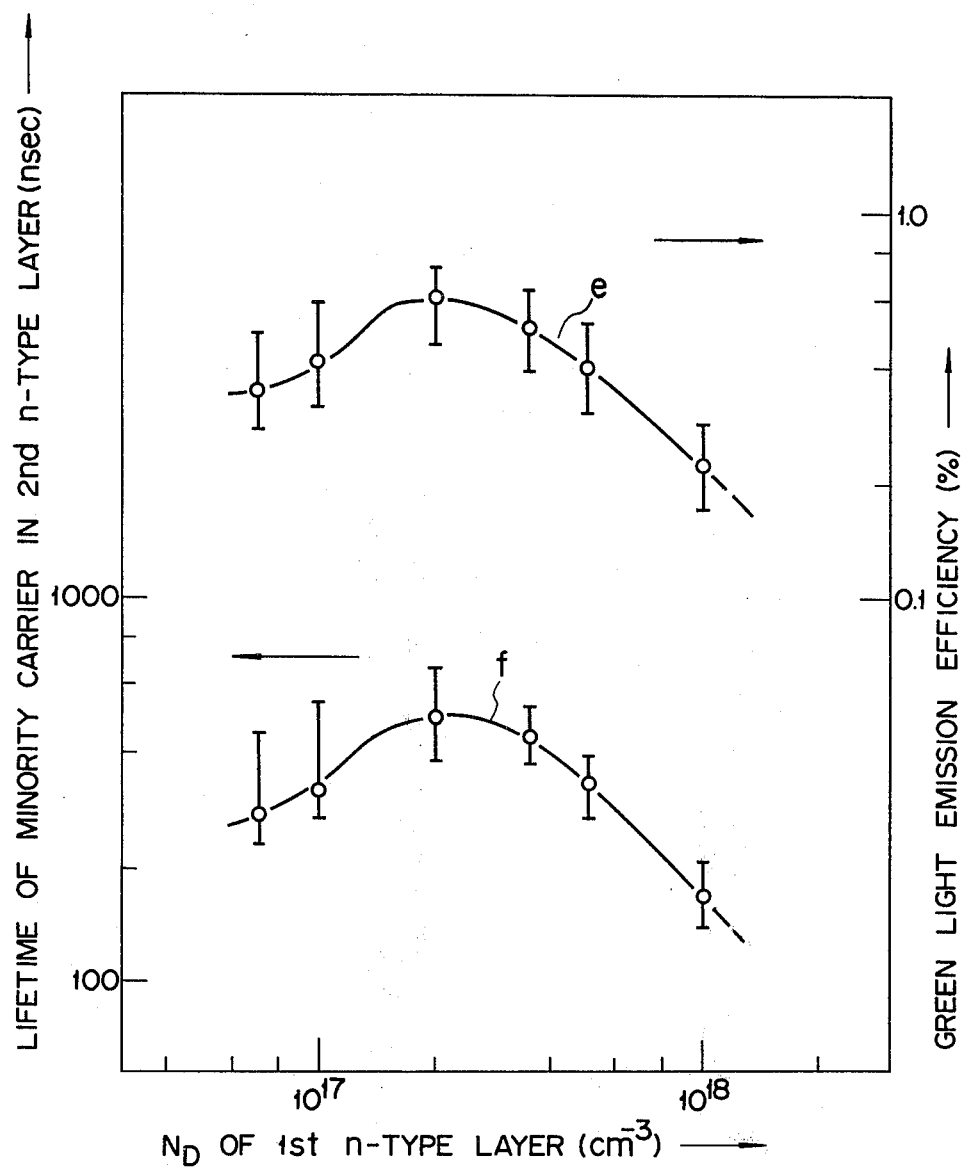
FIG. 10 is a graph illustrating the dependences of the lifetime of minority carriers in the second layer and the green light emission efficiency on $N_D$ of the n-type GaP layer part (1st layer) closer to an n-type GaP substrate.
Figure 12:
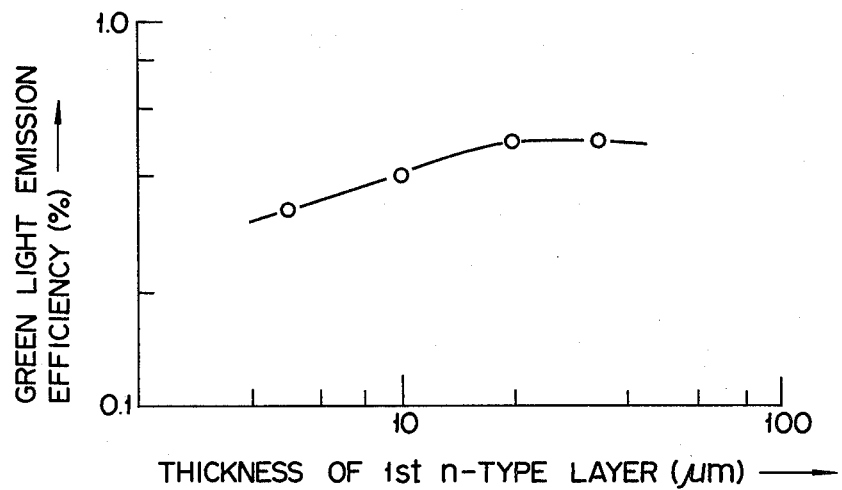
FIG. 12 is a graph illustrating a relation of the green light emission efficiency versus the thickness of the 1st layer.

As in the case of FIG. 8, an experiment was conducted of the relation between the $N_D$ of the first layer and the lifetime of the minority carrier in the second layer and between the same and the green light emission efficiency. The result of the experiment was plotted as a curve e in FIG. 10. The experiment was conducted under the condition that the current density was 25 A/cm², $N_T$ about $2 \times 10^{18}/cm^3$, $N_D$ of the second layer 1 to $5 \times 10^{16}/cm^3$ and the device is epoxy-molded. As shown in this Figure, under 1 to $5 \times 10^{16}/cm^3$ of the $N_D$ of the second layer, even when the $N_D$ of the first layer changes ranging from 1 to $5 \times 10^{17}/cm^3$, the light emission efficiency is 0.4% or more on the average and the lifetime of the minority carriers is 330 nsec or more. FIG. 10 also shows that there is a correlation between $N_D$ of the first and second layers. That is, when either the $N_D$ of the first or second layer changes to the value outside the predetermined range, the light emission efficiency of 0.4% or more on the average cannot be obtained. The light emission efficiency is slightly affected by the thickness of the first and second layers. This fact is shown in FIGS. 11 and 12. The light emission efficiency and the thickness of the second n-type layer are related as shown in FIG. 11 and the light emission efficiency and the thickness of the first n-type layer are related as shown in FIG. 12. As seen from the figures, 0.4% or more of light emission efficiency is obtained when the second layer thickness is 10 μm to 35 μm and when the first layer thickness is 10 μm or more.

Figure 13:
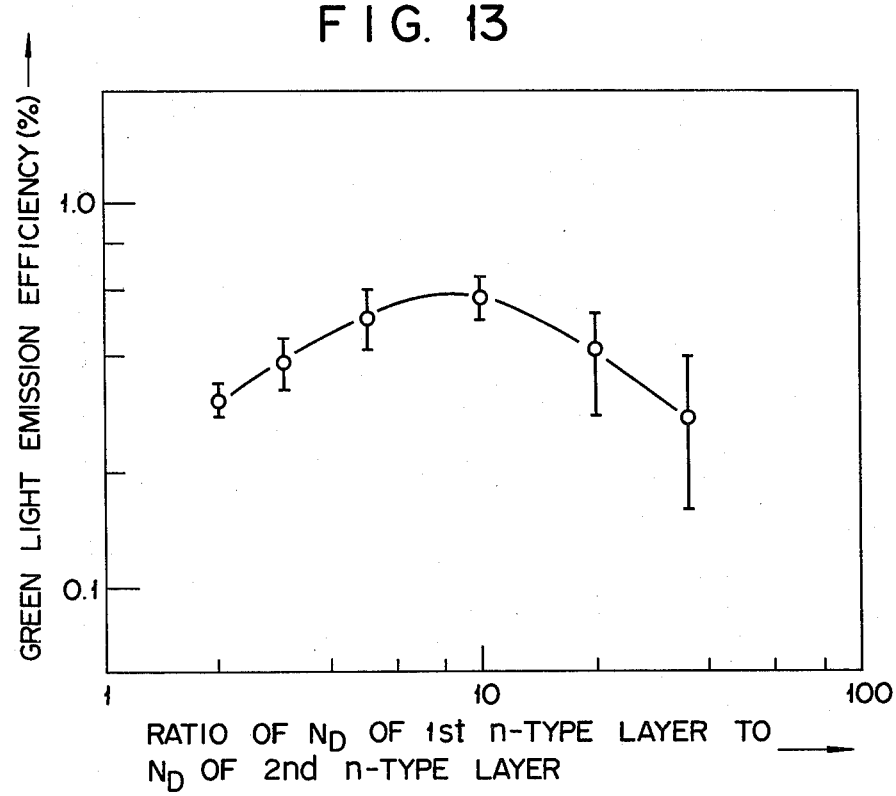
FIG. 13 diagrammatically illustrates a variation of the green light emission efficiency with respect to the ratio of $N_D$ of the 1st n-type layer to $N_D$ of the 2nd n-type layer.

The correlation between the donor concentrations $N_D$ between the first and second n-type layers is studied and is as shown in FIG. 13. FIG. 13 shows that when the ratio of the $N_D$ of the first n-type layer to that of the second n-type layer is within the range from 3 to 20, the light emission efficiency is 0.4% or more.

As described above, in the present invention, the $N_D$ of the first n-type layer on the n-type GaP substrate is preferably set within 1 to $5 \times 10^{17}/cm^3$ and the $N_D$ of the second n-type layer within 1 to $5 \times 10^{16}/cm^3$. Nitrogen is contained in only the second layer. The p-type GaP layer is formed on the second layer. With such a construction, 0.4% or more of the light emission efficiency can be obtained.

Incidentally, the measurement of $N_T$ and the lifetime of the minority carriers was made by the measuring technique described in the article of "IEEE Transaction on Electron Devices" Vol. ED-24, No. 7 on pages 951 to 955, which has been referred to in the Prior Art section of the specification.

In the specification, symbol $N_D$ indicates a net donor concentration, i.e. $N_D\text{-}N_A$, and $N_A$ a net acceptor concentration, i.e. $N_A\text{-}N_D$.

In the embodiments, sulfur (S) was used for the donor impurity for the n-type GaP substrate but tellurium (Te) or selenium (Se) may be used in place of sulfur. Additionally, various numerical values used in the embodiment may also be changed within the scope of the invention.

In the manufacturing method, the n-type layer and the p-type layer are epitaxially grown by making the substrate contact with the solution at approximately the highest temperature and then cooling them. Alternately, these may be made to contact to each other at a low temperature and then may be subjected to the maximum temperature. This will be described with reference to FIG. 14.

As shown by view b in FIG. 2, the GaP substrate 14 comes in contact with the gallium solution 16 when temperature in the reaction chamber 11 reaches 800° C. Then, the slider 15 moves the depression 14a to the right under the perforations 17 and this state is kept for about 30 minutes. In other words, these are baked at 800° C. for 30 minutes. In this step, the substrate 14 is melt-backed by about 5 μm and sulfur in this portion also is melted out, but the sulfur, together with the sulfide in the solution, is completely exhausted to the outside of the solution through the baking process of 30 minutes. Then, these are heated up to 1030° C. which is the epitaxial growth starting temperature. Through this heat treatment, the substrate is metal-backed to the depth of about 65 μm from the substrate surface. By the sulfur in the metal backed portion, the epitaxial growing solution contains the donor impurity of a given concentration. Under this condition, these are cooled at the cooling rate 2° C./min. to 950° C. thereby to form an n-type layer on the substrate. The following processes are performed in the similar manner of FIG. 3, with a slightly different processing time and cooling rate.

The "donor concentration" of the first layer means, according to this invention, the average donor concentration in the portion, excluding 3-micron thick film portions on both sides. The "donor concentration" of the second layer means, according to this invention, the average donor concentration in the portion, excluding a 3-micron thick film portion in contact with the first layer. The "abruptly changing step-like donor concentration" changes, according to this invention, preferably by $0.5\times10^{17}/\text{cm}^3$ or more over the distance of 6 microns.

The error bars added to curves a and b in FIGS. 5, 6 and 8 show the values in case the donor concentration of the first n-type layer is varied from $10^{17}/\text{cm}^3$ to $5\times10^{17}/\text{cm}^3$.

The error bars added to curves e and f in FIG. 10 show the values in case the donor concentration of the second n-type layer is varied from $10^{16}/\text{cm}^3$ to $5\times10^{16}/\text{cm}^3$.

What we claim is:

1. In a green light emitting device comprising an n-type GaP substrate, an n-type GaP layer formed on the substrate and a p-type GaP layer formed on the n-type GaP layer, the improvement wherein said n-type GaP layer includes a first layer formed on the GaP substrate and a second layer directly formed on the first layer, said second layer being closer to the p-type GaP layer, the net donor concentration in said first layer being higher than the net donor concentration in said second layer, the donor concentration in said first layer being abruptly decreased to that of said second layer, and said second layer containing nitrogen at a higher concentration than in said first layer.

2. A green light emitting device according to claim 1, wherein the net donor concentration in said first layer is at least twice the net donor concentration in said second layer.

3. A green light emitting device according to claim 1, wherein the net donor concentration of said first layer is lower than that of the n-type GaP substrate.

4. A green light emitting device according to claim 2, wherein the nitrogen concentration in the second layer is at least $1\times10^{18}/\text{cm}^3$.

5. A green light emitting device according to claim 2 or 4, wherein the thickness of the first layer is at least 10 μm and that of the second layer is 10 to 35 μm.

6. A green light emitting device according to claim 2 or 4, wherein the ratio of the net donor concentration of the first layer to that of the second layer falls within 3 to 20.

7. A green light emitting device according to claim 2 or 4, wherein a major donor impurity of the first layer is silicon and a major donor impurity of the second layer is one of sulfur and tellurium.

8. A green light emitting device according to claim 1, 2, 3, or 4, wherein the first and second layers, and the p-type GaP layer are liquid-phase epitaxial layers, respectively.

9. A green light emitting device according to claim 8, wherein the first and second layers are liquid-phase epitaxial layers formed by dissolving a portion of the substrate and recrystallizing the dissolved portion of the substrate.

10. A green light emitting device according to claim 5, wherein the ratio of the net donor concentration of the first layer to that of the second layer falls within 3 to 20.

11. A green light emitting device according to claim 5, wherein a major donor impurity of the first layer is silicon and a major donor impurity of the second layer is one of sulfur and tellurium.

12. A green light emitting device according to claim 6, wherein a major donor impurity of the first layer is silicon and a major donor impurity of the second layer is one of sulfur and tellurium.

13. A green light emitting device according to claim 5, wherein the first and second layers, and the p-type GaP layer are liquid-phase epitaxial layers, respectively.

14. A green light emitting device according to claim 13, wherein the first and second layers are liquid-phase epitaxial layers formed by dissolving a portion of the substrate and recrystallizing the dissolved portion of the substrate.

15. In a green light emitting device comprising an n-type GaP substrate, an n-type GaP layer formed on the substrate and a p-type GaP layer formed on the n-type GaP layer, the improvement wherein said n-type GaP layer includes a first layer formed on the GaP substrate and a second layer directly formed on the first layer, said second layer being closer to the p-type GaP layer, the net donor concentration in said first layer being between $1\times10^{17}/\text{cm}^3$ and $5\times10^{16}/\text{cm}^3$, the net donor concentration in said second layer being between $1\times10^{16}/\text{cm}^3$ and $5\times10^{16}/\text{cm}^3$, the donor concentration in said first layer being abruptly decreased to that of said second layer, and said second layer containing nitrogen at a higher concentration than in said first layer.

* * * * *